United States Patent [19]

Maruo

[11] Patent Number: 5,696,659
[45] Date of Patent: Dec. 9, 1997

[54] OVERCURRENT PROTECTIVE CIRCUIT AND SEMICONDUCTOR DEVICE

[76] Inventor: Masaya Maruo, 119-1, Hiyama, Tatsumo-cho, Tatsuno-shi, Hyogo, 679-41, Japan

[21] Appl. No.: 495,585
[22] PCT Filed: Jul. 16, 1993
[86] PCT No.: PCT/JP93/01001
§ 371 Date: Oct. 20, 1995
§ 102(e) Date: Oct. 20, 1995
[87] PCT Pub. No.: WO94/18736
PCT Pub. Date: Aug. 18, 1994

[30] Foreign Application Priority Data

Feb. 10, 1993 [JP] Japan .................................. 5-045984
Jun. 5, 1993 [JP] Japan .................................. 5-160460

[51] Int. Cl.⁶ .......................................... H02H 3/22
[52] U.S. Cl. ...................................... 361/93; 361/111
[58] Field of Search ................... 361/93, 94, 98, 361/111, 58

[56] References Cited

U.S. PATENT DOCUMENTS 3,916,220  10/1975  Roveti .
4,533,970   8/1985  Brown ................................. 361/58
5,115,369   5/1992  Robb et al. ......................... 361/93
5,319,515   6/1994  Pryor et al. ......................... 361/93

*Primary Examiner*—Jeffrey A. Gaffin
*Assistant Examiner*—Michael J. Sherry
*Attorney, Agent, or Firm*—Smith Patent Office

[57] ABSTRACT

An overcurrent protective circuit in which the source of an N-type depletion MOS (1) is connected to the source of a P-type depletion MOS (2), the gate of the N-type depletion MOS (1) to the drain of the P-type depletion MOS (2) through a resistor and others, and the gate of the P-type depletion MOS (2) is connected to the drain of the N-type depletion MOS (1) through a resistor and others. A semiconductor circuit to which such an overcurrent protective circuit is connected in parallel through a rated value correcting circuit. Also, this invention provides an overcurrent cut-off circuit which operates, fundamentally, on the same cut-off principle as that of the above-mentioned overcurrent protective circuit and which constitutes an enhanced MOS. Then, by arranging the gate circuit so that the gate voltage does not become greater than a certain value, the overcurrent is suppressed to approximately 1.5 to 2 times the rated current, thus effectuating the cut-off.

8 Claims, 10 Drawing Sheets

OVERCURRENT PROTECTIVE CIRCUIT AND SEMICONDUCTOR DEVICE

BACKGROUND OF THE INVENTION

1. Field of the Invention

The present invention relates to an overcurrent protective circuit and semiconductor for protecting a load circuit from overcurrent, which can be easily connected in series to the load circuit in the same way as a fuse and a breaker and which can also be controlled in a quick or a delayed manner depending on the characteristic of the load circuit.

2. Discussion of the Related Art

Hitherto, as means for protecting the load circuit which is connected in series thereto, a fuse and a breaker have been used. The fuse acts to cut off the overcurrent by a fusing action due to the overcurrent flow, so that on all such occasions changing the fuse is needed. The fusing speed is not sufficient to protect the latest electronic circuit. On the other hand, the breaker has a slow cut-off speed, so that the breaker is not used for a circuit requiring quick action.

Further, the fuse and the breaker have a problem that a rush current on switching flows into the load circuit and an overcurrent flows through the load circuit for a short time, which gives stress and degradation to normal circuit elements, resulting in breakdown of the load circuit.

SUMMARY OF THE INVENTION

Accordingly, a first object of the present invention is to provide an overcurrent protective circuit or semiconductor circuit which can be connected in series to the load circuit in the same easy way as the fuse and the breaker and which need not be changed every time the overcurrent flows and which has a cut-off characteristic or speed that can be adjusted depending on the load circuit to protect the latest electronic circuit.

Further, a second object of the present invention is to provide an overcurrent protective circuit or semiconductor circuit in which in a case that a rush current flows, the rush current is suppressed to approximately 1.5 to 2 times the stationary current until the rush current state from supplying power is terminated and after that, the stationary current can be made to flow. In a case that an overcurrent flows, the overcurrent is suppressed to approximately 1.5 to 2 times of the stationary current for a short permissible time of the load circuit and after that, the stationary current can be made to flow. However, in the case that the state of overcurrent flow is still continuing after that, the overcurrent is made to be cut-off.

Furthermore, a third object of the present invention is to provide an AC-type overcurrent protective circuit or semiconductor circuit designed to cut-off the alternating overcurrent by symmetrical arrangement of the first objective overcurrent protective circuit.

According to a first aspect of the present invention, there is provided an overcurrent protective circuit (hereinafter referred to as a first overcurrent protective current) which comprises a first N-type depletion MOS (hereinafter referred to as N-type DMOS) which drain is a positive outer terminal of the circuit and a first P-type depletion MOS (hereinafter referred to as P-type DMOS) which drain is a negative outer terminal of the circuit. The source of the N-type DMOS is connected to the source of the P-type DMOS, the gate of the N-type DMOS is connected to the drain of the P-type DMOS through a resistor or the like and the gate of the P-type DMOS is connected to the drain of the N-type DMOS through a resistor or the like.

In the first overcurrent protective circuit, when an overcurrent flows in a way that the drain of the first N-type DMOS is positive while the drain of the first P-type DMOS is negative, the overcurrent increases the potential difference of the N-type DMOS and the P-type DMOS, which causes the gate voltage of the N-type DMOS and the P-type DMOS to increase. Further, the increased gate voltage of the N-type DMOS and the P-type DMOS makes the potential difference of the N-type DMOS and the P-type DMOS increase further in a repeat manner, resulting in cut-off of the overcurrent, since the potential difference of the P-type DMOS becomes the gate voltage of the N-type DMOS while the potential difference of the N-type DMOS becomes the gate voltage of the P-type DMOS.

According to a second aspect of the present invention, there is provided an overcurrent protective circuit or semiconductor circuit wherein between the gate and the drain of an enhancement MOS (hereinafter referred to as EMOS) there is connected an overcurrent cut-off circuit which operates fundamentally on the same cut-off principle as that of the first overcurrent protective circuit and the gate and the source of the EMOS are connected through a resistor and the like to constitute a gate circuit in such a way that the gate voltage of the EMOS does not become larger than a certain value above the threshold voltage.

In this overcurrent protective circuit, a two-terminal designed circuit is called a second overcurrent protective circuit and a three-terminal designed circuit provided with another terminal for supplying the gate voltage is called a third overcurrent protective circuit.

In the second overcurrent protective circuit, when a voltage is applied gradually between the source and the drain of the EMOS, first a current flows through the overcurrent cut-off circuit connected between the gate and the drain of the EMOS. When the current becomes large little by little and the voltage drop of the resistor connected between the gate and the source of the EMOS is above the threshold voltage, the drain current begins to flow.

Further, when the voltage applied to the EMOS becomes larger, the gate current flowing through the overcurrent cut-off circuit between the gate and the drain of the EMOS becomes larger and the drain current in the linear region becomes larger. When the voltage applied to the EMOS becomes still larger, a much larger drain current tends to flow. However, the gate voltage of the EMOS can not become larger than the certain value. Therefore, the drain current comes to be saturated and therefore becomes constant.

As mentioned above, the overcurrent cut-off circuit between the gate and the drain will be cut-off if a current of larger than a certain value flows.

If the large voltage is applied between both ends of the EMOS and the overcurrent flows, the drain current becomes saturated and constant as mentioned above. If the gate circuit is designed to make a current of more than a determined value flow through the overcurrent cut-off circuit between the gate and the drain of the EMOS, the overcurrent cut-off circuit becomes in a state of cut-off after a delayed amount of time passes, resulting in cut-off of the gate current and thus cut-off of the drain current due to the overcurrent.

Accordingly, the EMOS circuit can act as an overcurrent protector which can suppress the drain current to a constant even if the drain current is large and also can cut-off the drain current.

According to a third aspect of the present invention, there is provided an overcurrent protective circuit or semiconductor circuit for alternating current wherein two of the first objective overcurrent circuits are connected each other in an opposite direction and in series. That is, the source of a first N-type DMOS is connected to one side of the P-type DMOS while the other side of the P-type DMOS is connected to the source of a second N-type DMOS. Further, the gate of the first N-type connected through a resistor and the like to the drain of the second N-type DMOS while the gate of the second N-type DMOS is connected through a resistor and the like to the drain of the first N-type DMOS. Furthermore, the gate of the P-type DMOS is connected through a resistor and the like to the drain of the first N-type DMOS as well as through a resistor and the like to the drain of the second N-type DMOS. In this circuit, the drains of the first N-type DMOS and the second N-type DMOS are used as 2 terminals.

DETAILED DESCRIPTION OF THE PREFERRED EMBODIMENTS

Initially, the first overcurrent protective circuit according to the present invention is explained with reference to FIG. 1 in FIG. 1.

Figure 1:
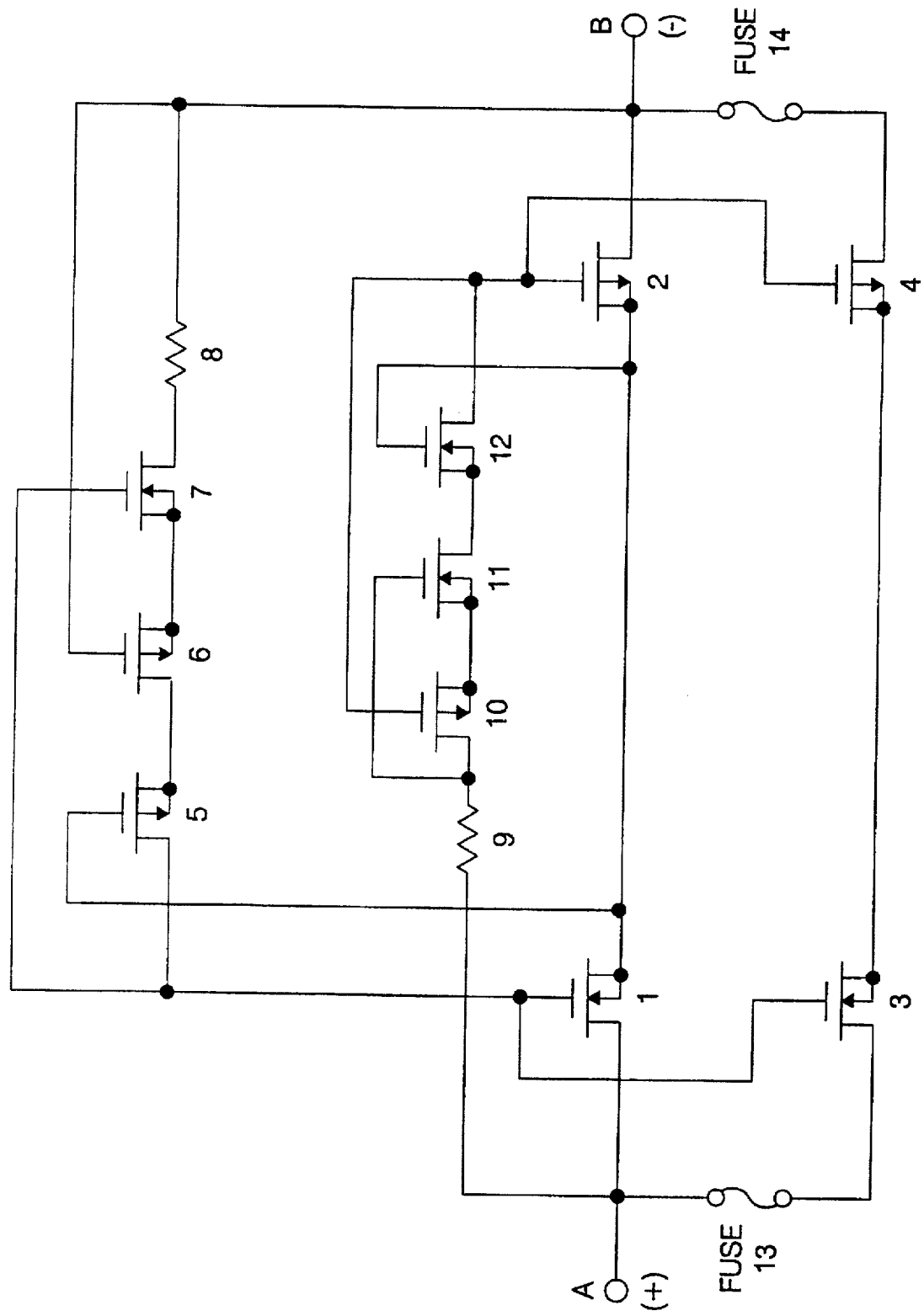
FIG. 1 is a circuit diagram showing the first overcurrent protective circuit according to the present invention.

In FIG. 1, the source of a N-type DMOS 1 is connected to the source of a P-type DMOS 2, and the gate of the N-type DMOS 1 is connected to the drain of a P-type DMOS 5. The source of the P-type DMOS 5 is connected to the drain of a P-type DMOS 6, and the source of the P-type DMOS 6 is connected to the source of a N-type DMOS 7. A resistor 8 is connected between the drain of the N-type DMOS 7 and the drain of the P-type DMOS 2.

The gate of the P-type DMOS 5 is connected to the source of the N-type DMOS 1, and the gate of the P-type DMOS 6 is connected to the drain of the P-type DMOS 2. The gate of the N-type DMOS 7 is connected to the drain of the P-type DMOS 5 (i.e., the gate of the N-type DMOS 1).

A resistor 9 is connected at one end to the drain of a P-type DMOS 10 and at its other end to the drain of the N-type DMOS 1. The source of the P-type DMOS 10 is connected to the source of a N-type DMOS 11, and the drain of the N-type DMOS 11 is connected to the source of a N-type DMOS 12. The drain of the N-type DMOS 12 is connected to the gate of the P-type DMOS 2, and the gate of the P-type DMOS 10 is connected the drain of the N-type DMOS 12 (i.e., the gate of the P-type DMOS 2). The gate of the N-type DMOS 11 is connected to the drain of the P-type DMOS 10, and the gate of the N-type DMOS 12 is connected to the source of the P-type DMOS 2.

The drain of a N-type DMOS 3 is connected through a fuse 13 to the drain of the N-type DMOS 1 and the gate of the N-type DMOS 3 is connected to the gate of the N-type DMOS 1, and the source of the N-type DMOS 4 is connected to the source of P-type DMOS 4. The drain of the P-type DMOS 4 is connected through a fuse 14 to the drain of the P-type DMOS 2. The gate of a P-type DMOS 4 is connected to the gate of the P-type DMOS 2.

It is the circuit for preventing overcurrent to the load, in which the drain of the N-type DMOS 1 is a positive outer terminal A and the drain of the P-type DMOS 2 is a negative outer terminal B.

The function of each parts is as follows.

According to this connection, when a voltage VAB is applied across the outer terminal A with positive potential and the outer terminal B with negative potential, the potential difference in the P-type DMOS 2 is the gate voltage of the N-type DMOS 1, and the potential difference in the N-type DMOS 1 is the gate voltage of the P-type DMOS 2.

Therefore, when the voltage VAB increases gradually, then the current IAB to flow through the N-type DMOS 1 and the P-type DMOS 2 increases gradually. It is connected so as to increase the gate voltage of the P-type DMOS 2 as the potential difference in the N-type DMOS 1 increases, and also so as to increase the gate voltage of the N-type DMOS 1 as the potential difference in the P-type DMOS 2 increases. Thereby, when the voltage VAB increases to grow the current IAB, then the potential differences in the N-type DMOS 1 and P-type DMOS 2 increase to grow the gate voltages of the N-type DMOS 1 and the P-type DMOS 2.

As more and more increases occur in the voltage VAB, the potential differences in the N-type DMOS 1 and the P-type DMOS 2 will be higher and higher. Therefore the gate voltages of the N-type DMOS 1 and the P-type DMOS 2 become higher. Accordingly, the N-type DMOS 1 and the P-type DMOS 2 come to prevent the current IAB from increasing and then reduce the current IAB. After that, the N-type DMOS 1 and the P-type DMOS 2 reach to a pinch-off state and cut off the current IAB.

Figure 2:
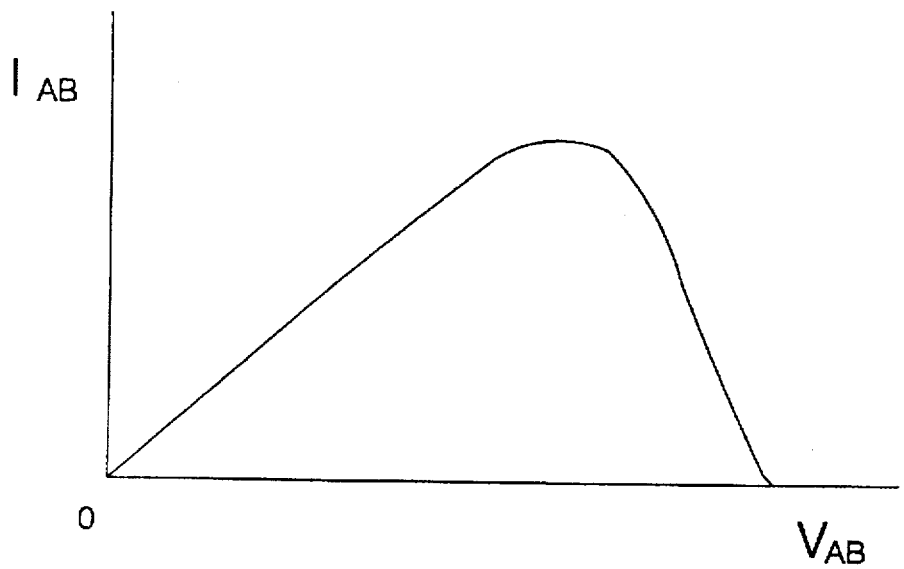
FIG. 2 is a graph showing a static cut-off characteristic of the circuit shown in FIG. 1.

As is seen in FIG. 2, from the starting voltage 0, the current IAB increases as the voltage VAB increases, and after the current IAB reaches to local maxima, the current IAB declines as the voltage VAB increases. Finally, the current IAB reaches to a cut-off state by repeating such operation. That is the operation to protect the load from the overcurrent.

The cut-off static characteristic of the first circuit to prevent overcurrent is shown in FIG. 2.

The P-type DMOS 5 and 6 and the N-type DMOS 7 to be connected to the gate of the N-type DMOS 1 functions as follows.

When a pulse voltage VAB is applied across the outer terminal A with positive potential and the outer terminal B with negative potential, a cyclic current IAB flows through the N-type DMOS 1 and the P-type DMOS 2.

When the current IAB is about the rated value, the potential differences in the N-type DMOS 1 and the P-type DMOS 2 are small, thus the gate voltage and the potential difference of P-type DMOS 5 are very small.

Therefore, when the current IAB reaches a cut-off state, then the voltage impressed across two outer terminals A and B, i.e., across the drain of the N-type DMOS 1 and the drain of the P-type DMOS 2, is a power source voltage. Consequently, the gate voltages of the N-type DMOS 1 and the P-type DMOS 2 increase. And since the drain of a P-type DMOS 5 is connected to the gate of the N-type DMOS 1 and the gate of the P-type DMOS 5 is connected to the source of the N-type DMOS 1, the gate voltage of the P-type DMOS 5 increases, and the potential difference of the P-type DMOS 5 increases.

The drain of a P-type DMOS 6 is connected to the source of the P-type DMOS 5, and the source of the P-type DMOS 6 is connected to the source of a N-type DMOS 7. A resistor 8 is connected at one end to the drain of the N-type DMOS 7 and is connected at its other end to the drain of the P-type DMOS 2. The gate of the P-type DMOS 6 is connected to the drain of the P-type DMOS 2, and the gate of the N-type DMOS 7 is connected to the drain of the P-type DMOS 5 (i.e., the gate of the N-type DMOS 1). Therefore, when a current flows through the P-type DMOS 6 to the N-type DMOS 7, the P-type DMOS 6 and the N-type DMOS 7 achieve a low resistance state. Since the potential differences of the P-type DMOS 5 and 6 are the gate voltage of the N-type DMOS 7, and the potential difference of the N-type DMOS 7 is the gate voltage of the P-type DMOS 6, when a current flows through the N-type DMOS 7 to the P-type DMOS 6, the P-type DMOS 6 and the N-type DMOS 7 achieve a high resistance state or a cut-off state.

Accordingly, the cyclic current IAB is the cut-off state, and the pulse voltage VAB shifts to the cycle of 0 volt voltage reducing the voltage from the voltage adding cycle. As the gate voltage of the N-type DMOS 1 charged at the voltage adding cycle discharges, the reverse gate current tends to flow through the N-type DMOS 7 to the P-type DMOS 6. However, a large potential difference of the P-type DMOS 5 will come to be the gate voltage of the N-type DMOS 7, so that the potential difference of the N-type DMOS 7 increases. In addition, the gate voltage and the potential difference of the P-type DMOS 6 become high due to the large potential difference in the N-type DMOS 7. As a result, the P-type DMOS 6 and the N-type DMOS 7 achieve the high resistance state or the cut-off state. Thereby, the cut-off state of the N-type DMOS 1 is maintained because the gate voltage of the N-type DMOS 1 is kept undischarged.

Similarly, when the gate charge-current of the P-type DMOS 2 flows through the P-type DMOS 10 to the N-type DMOS 11, the P-type DMOS 10 and the N-type DMOS 11 and 12 to be connected to the gate of the P-type DMOS 2 become a low resistance state, thus the gate charge-current of the P-type DMOS 2 can flow. Conversely, when the gate discharge-current of the P-type DMOS 2 flows through the N-type DMOS 11 to the P-type DMOS 10, the P-type DMOS 10 and the N-type DMOS 11 and 12 to be connected to the gate of the P-type DMOS 2 become a high resistance state or a cut-off state, thus the gate discharge-current of the P-type DMOS 2 cannot flow. Thereby, the cut-off state of the P-type DMOS 2 is maintained because the gate voltage of the P-type DMOS 2 is kept undischarged.

As the result, the cut-off state of the first circuit to prevent overcurrent of one example of the present invention is maintained until the next voltage adding cycle, therefore, this circuit cut off a pulse overcurrent without a sharp-pointed current at each pulse cycle.

When a resistance of the resistor 8 to be connected to the gate of the N-type DMOS 1 and a resistance of the resistor 9 to be connected to the gate of the P-type DMOS 2 are small, then the cut-off time is fast (quick), and when large, then it is slow (delay).

When the first circuit to prevent overcurrent of the present invention is made as a monolithic semiconductor chip, the reference cut-off current of the monolithic semiconductor chip is uneven.

In the manufacturing process of the monolithic semiconductor chip, the electric characteristic of each device comprising the monolithic semiconductor chip is uneven, thereby the reference cut-off current of the monolithic semiconductor chip is uneven. For a correction of the reference cut-off current of each monolithic semiconductor chip, a correction circuit of N-type DMOS 3 and P-type DMOS 4 which can be separated is connected to the main circuit of the N-type DMOS 1 and the P-type DMOS 2 in parallel.

When the reference cut-off current of the monolithic semiconductor chip exceeds a region of quality, the correction circuit is separated from the main circuit to reduce the reference cut-off current and thus enter in the region of good quality.

Conversely, when the reference cut-off current of the monolithic semiconductor chip does not reach to the region of good quality, the correction circuit is separated to reduce the reference cut-off current and enters a lower region of quality.

A fuse 13 is connected at one end to the drain of the N-type DMOS 1 and is connected at its other end to the drain of the N-type DMOS 3. The gate of the N-type DMOS 3 is connected to the gate of the N-type DMOS 1, the source of the N-type DMOS 3 is connected to the source of the P-type DMOS 4, and the gate of the P-type DMOS 4 is connected to the gate of the P-type DMOS 2. A fuse 14 is connected at one end to the drain of the P-type DMOS 2 and is connected at its other end to the drain of the P-type DMOS 4.

By way of example, the drain current capacity of the N-type DMOS 1 will be 89% of the total drain current capacity of the N-type DMOS 1 and 3, and the drain current capacity of the N-type DMOS 3 will be 11% of it. Similarly, the drain current capacity of the P-type DMOS 2 will be 89% of the total drain current capacity of the P-type DMOS 2 and 4, and the drain current capacity of the P-type DMOS 4 will be 11% of it.

When a monolithic semiconductor chip of the rated cut-off current 100 mA is produced, if a region of quality of the rated cut-off current 100 mA is between 94 and 106 mA, the fuses 13 and 14 in the monolithic semiconductor chip which the reference cut-off current exceeds 106 mA are melted by a laser beam and others. The N-type DMOS 3 is separated from the N-type DMOS 1, and the P-type DMOS 4 is separated from the P-type DMOS 2. Therefore, the reference cut-off current which exceeds 106 mA falls by 11%, and drops within the limits from 94 to 106 mA. Thus, the monolithic semiconductor chip can be a quality product.

Similarly, the fuses 13 and 14 in the monolithic semiconductor chip which the reference cut-off current is below 94 mA, are melted by a laser beam and others. Thereby, the reference cut-off current falls by 11%, and drops within the limits from 75 to 85 mA of a region of quality of the rated cut-off current 80 mA. Thus, the monolithic semiconductor chip can be a quality product.

Accordingly, with a scattering of the reference cut-off current, a ratio of the drain current capacity between the N-type DMOS 1 and 3 and between the P-type DOMS 2 and 4 is adjusted. Thereby, almost all the monolithic semiconductor chip can be a quality product.

The drain current capacity of the N-type DMOS 1 can be between 85% and 95% of the total drain current capacity of the N-type DMOS 1 and 3, while the drain current capacity of the N-type DMOS 3 can be between 5% and 15% of the total drain current capacity of the N-type DMOS 1 and 3. The drain current capacity of the P-type DMOS 2 can be between 85% and 95% of the total drain current capacity of the P-type DMOS 2 and 4, while the drain current capacity of the P-type DMOS 4 can be between 5% and 15% of the total drain current capacity of the P-type DMOS 2 and 4.

Figure 3:
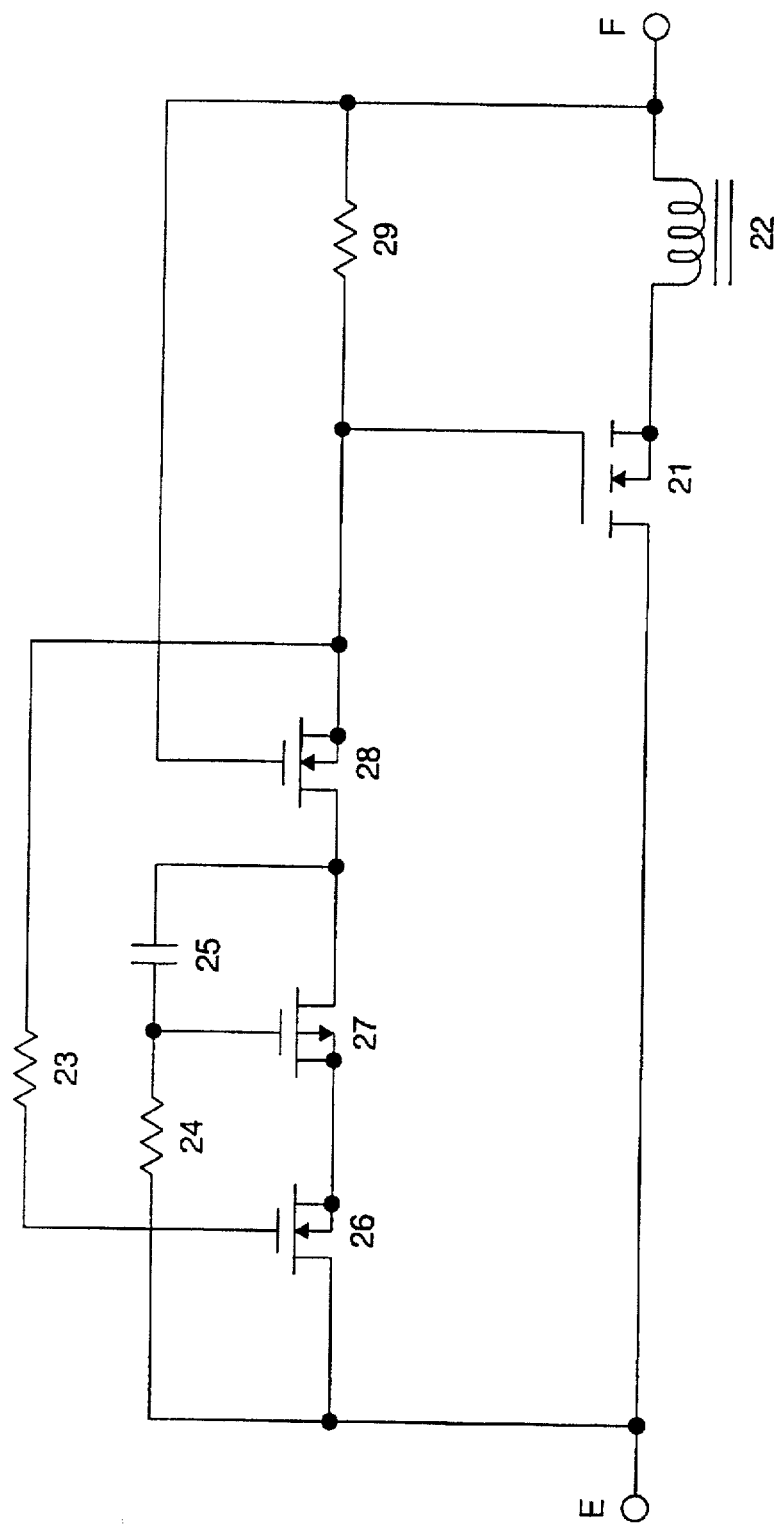
FIG. 3 is a circuit diagram showing the second overcurrent protective circuit according to the present invention.

Next, there is explained a second embodiment of the overcurrent protective circuit according to the present invention of FIG. 3.

The drain of an enhancement mode N-type MOS (hereinafter referred to as N-type EMOS) 21 is connected to the drain of a N-type DMOS 26, and the source of a N-type DMOS 26 is connected to the source of a P-type DMOS 27. The drain of the P-type DMOS 27 is connected to the drain of a N-type DMOS 28, and the source of the N-type DMOS 28 is connected to the gate of the N-type EMOS 21.

The drain of the N-type EMOS 21 is one outer terminal E, which source is connected to one end of a coil 22. The other end of coil 22 which is not joined to the source of the N-type EMOS 21 is connected to the other outer terminal F. A resistor 29 is connected at one end to the gate of the N-type EMOS 21 and is connected at its other end to the outer terminal F.

A resistor 23 is connected at one end to the gate of the N-type DMOS 26 and is connected at its other end to the source of the N-type DMOS 28 (i.e., the gate of the N-type EMOS 21). A resistor 24 is connected at one end to the gate of the P-type DMOS 27 and is connected at its other end to the drain of the N-type DMOS 26 (i.e., the drain of the N-type EMOS 21). A capacitor 25 is connected at one end to the gate of the P-type DMOS 27 and is connected at its other end to the drain of the P-type DMOS 27. The gate of the N-type DMOS 28 is connected to the outer terminal F.

The function of each parts is explained as follows.

In the N-type DMOS 26 and the P-type DMOS 27 which are connected between the drain and the gate of the N-type EMOS 21, the potential difference in N-type DMOS 26 is the gate voltage of P-type DMOS 27, and the potential difference in P-type DMOS 27 is the gate voltage of N-type DMOS 26. When a voltage VEF is applied across the outer terminal E with positive potential and the outer terminal F with negative potential, from the starting voltage 0, the gate current of the N-type EMOS 21 which flows through the N-type DMOS 26 and 28 and P-type DMOS 27 increases as the voltage VEF increases, and after its gate current reaches a preset value, its gate current declines as the voltage VEF increases. Finally, the N-type DMOS 26 and P-type DMOS 27 reach to a cut-off state, thereby its gate current is cut-off.

Now, when the voltage VEF increases, the drain current of the N-type EMOS 21 can not flow for a time from the starting voltage 0. However, the gate current of the N-type EMOS 21 can flow through the N-type DMOS 26 to resistor 29 from the starting voltage 0, because its gate circuit is composed of depletion mode FETs. A voltage drop in the resistor 29 is the positive gate voltage of the N-type EMOS 21. The gate current of the N-type EMOS 21 increases as the voltage VEF increases, therefore when the voltage drop in the resistor 29 exceeds the threshold voltage of the N-type EMOS 21, the N-type EMOS 21 becomes conductive. Thereby the drain current IEF of the N-type EMOS 21 can flow from the outer terminal E to the N-type EMOS 21 and through the coil 22 to the outer terminal F.

The gate current of the N-type EMOS 21 increases as the voltage VEF increases, and since the voltage drop of the resistor 29 increases, the drain current of the N-type EMOS 21 increases as its gate voltage increases.

As the voltage VEF increases further, the gate current of the N-type EMOS 21 increases more until the preset value. Though when the gate current of the N-type EMOS 21 exceeds the preset value, the N-type DMOS 26 and P-type DMOS 27 cuts off the gate current of the N-type EMOS 21. Thus the gate voltage of the N-type EMOS 21 drops to voltage 0 to cut off its drain current IEF.

Figure 4:
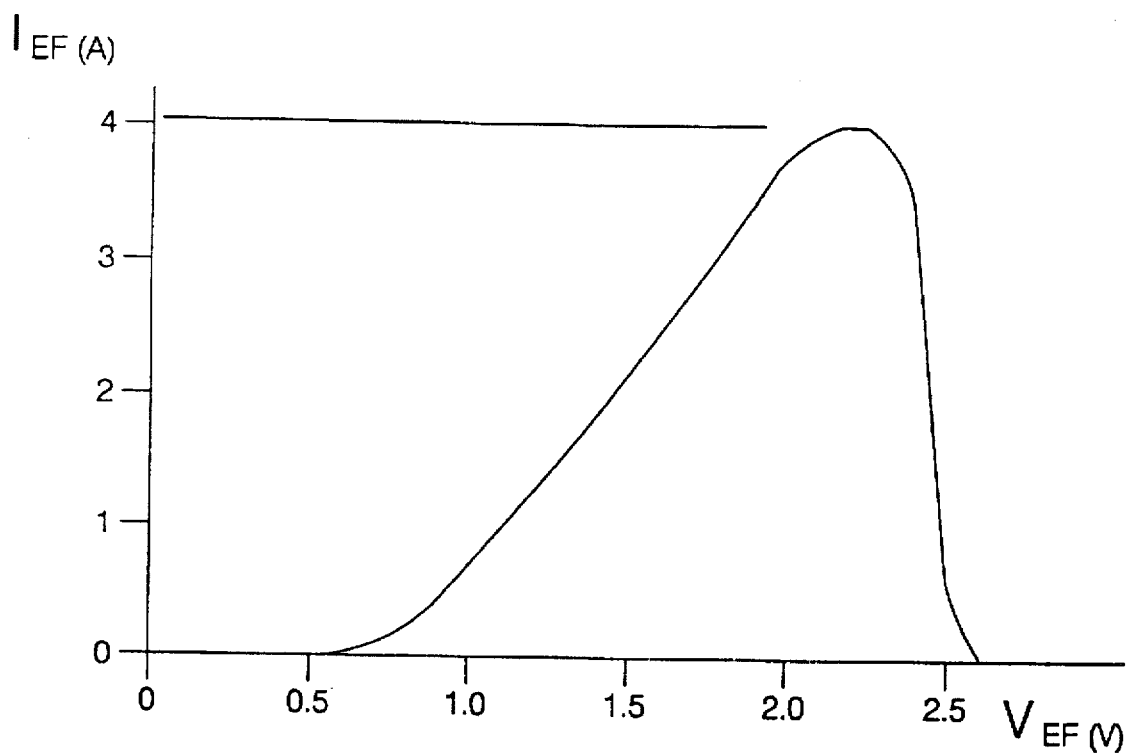
FIG. 4 is a graph showing a static cut-off characteristic of the circuit shown in FIG. 3.

FIG. 4 shows a graph indicating voltage-current static characteristic of the second circuit to prevent overcurrent of the one example of the present invention. From the voltage VEF of about 0.6 volts, the current IEF can flow. When the voltage VEF is about 2 volts, the current is 4 A. After the voltage VEF exceeds about 2.3 volts, the current IEF declines as the voltage VEF increases. When the voltage VEF exceeds about 2.6 volts, the current IEF reaches to a cut-off state. Therefore this circuit to prevent overcurrent has a voltage-current static characteristic as follows: The rated current is 3 A, and the maximum load current (i.e., a maximum non-cut-off current) is 4 A, and the load current is cut-off when the load current exceeds 4 A.

This overcurrent protective circuit needs to have a delay characteristic which allows a short-time overcurrent within the permissible range of the load to flow.

The N-type DMOS 28 and resistor 29 which are connected to the gate of the N-type EMOS 21 constitutes a constant current circuit, in which the constant current of the circuit is set to more than the cut-off current of the N-type DMOS 26 and the P-type DMOS 27.

When the drain current IEF tends to increase over 4 A, a constant gate current of the N-type EMOS 21 flows, and the potential difference (the voltage drop) in the N-type DMOS 28 increases. Therefore, the potential difference in the N-type DMOS 26 increases as its gate voltage increases. However, a resistor 24 is connected at one end to the gate of the P-type DMOS 27 and is connected at its other end to the drain of the N-type DMOS 26 and a capacitor 25 is connected at one end to the gate of the P-type DMOS 27 and is connected at its other end to the drain of the P-type DMOS 27. Thereby, when the potential difference in the N-type DMOS 26 increases quickly, the gate voltage of the P-type DMOS 27 increases after a delay time which is proportional to a time constant of the resistor 24 and the capacitor 25. Thus the drain current IEF is kept the maximum load current (4 A) and flows for a short-time within a permissible range of the load.

When the drain current IEF flows a long time, after the delay time which is proportional to the time constant, the gate voltage of the P-type DMOS 27 increases. Therefore, the N-type DMOS 26 and P-type DMOS 27 reach to a cut-off state, thereby the gate current of the N-type EMOS 21 is cut-off. Accordingly, the N-type EMOS 21 becomes non-conductive to cut off its drain current IEF.

Next, there is explained the function in the case that a rush current flows into the load circuit on supplying power.

When the rush current on turning on a power source tends to flow into the load, the gate current of the N-type EMOS 21 is constant due to the constant current circuit of the N-type DMOS 28 and the resistor 29. Due to the constant current, the voltage drop of the resistor 29 is constant. When a rush current of a power source begin to flow quickly, a sudden change of current is stopped due to a inductance of the coil 22, thereby a large voltage is generated at both ends of the coil 22 for an instant.

Accordingly, while the voltage drop in the resistor 29 is constant, the gate voltage of the N-type EMOS 21 drops for an instant due to the large voltage generated at both ends of the coil 22. After that, the gate voltage of the N-type EMOS 21 is charged with its gate current, thus the rush current is suppressed to the maximum load current 4 A without a sharp-pointed current. After the rush current finishes, the load current of 2 A flows normally through the N-type EMOS 21 to the load.

Figure 5:
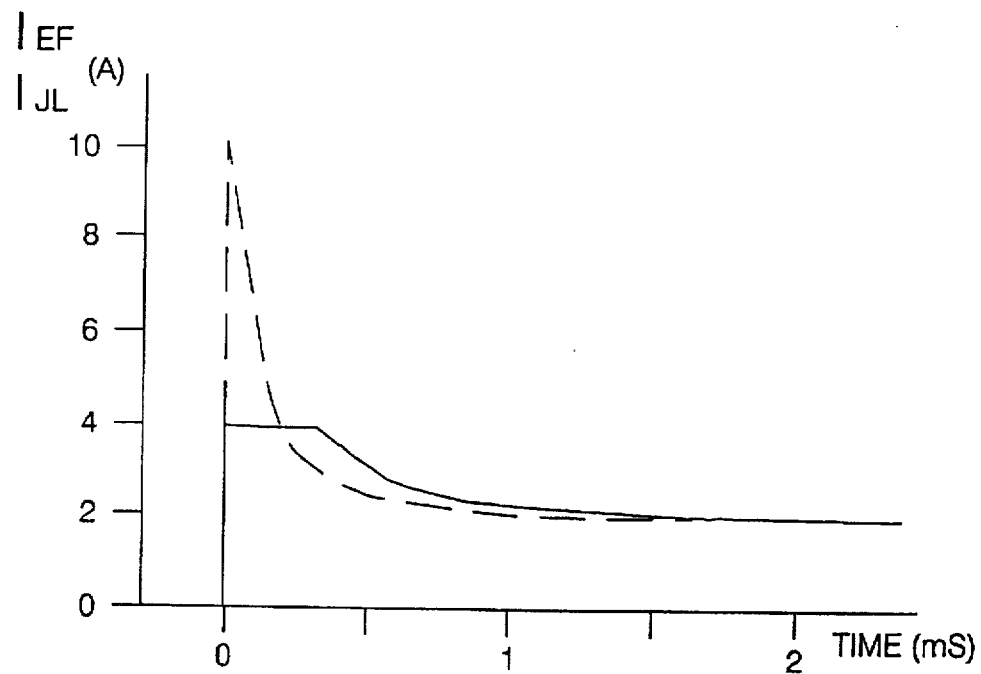
FIG. 5 shows a characteristic of the circuit shown in FIG. 3 against the rush current and FIG. 6 shows a characteristic of the circuit shown in FIG. 3 against the overcurrent.

FIG. 5 shows a current IEF—voltage VEF static characteristic of this overcurrent protective circuit when the rush current flows.

The solid line shows a rush current when this overcurrent protective circuit is used. When a power source is turned on, the rush current increases to 4 A and is kept to 4 A for about 0.3 mS. After that, the rush current declines gradually to a normal current 2 A about 2 mS later.

The broken line shows a rush current without use of this overcurrent protective circuit. When a power source is turned on, the rush current increases to 10 A. After that, the rush current declines to 4 A about 0.2 mS later, and to a normal current 2 A about 1 mS later.

When an overcurrent flows suddenly under flowing of a normal current 2 A in the load, the overcurrent increases to 4 amperes and is suppressed to the maximum load current 4 A by N-type EMOS 21. When the overcurrent finishes within a permissible time of the load, the current returns to a normal current 2 A in the load again. When the overcurrent does not finish within a permissible time of the load, after the permissible time of the load, the N-type EMOS 21 becomes non-conductive to cut off the overcurrent.

Figure 6:
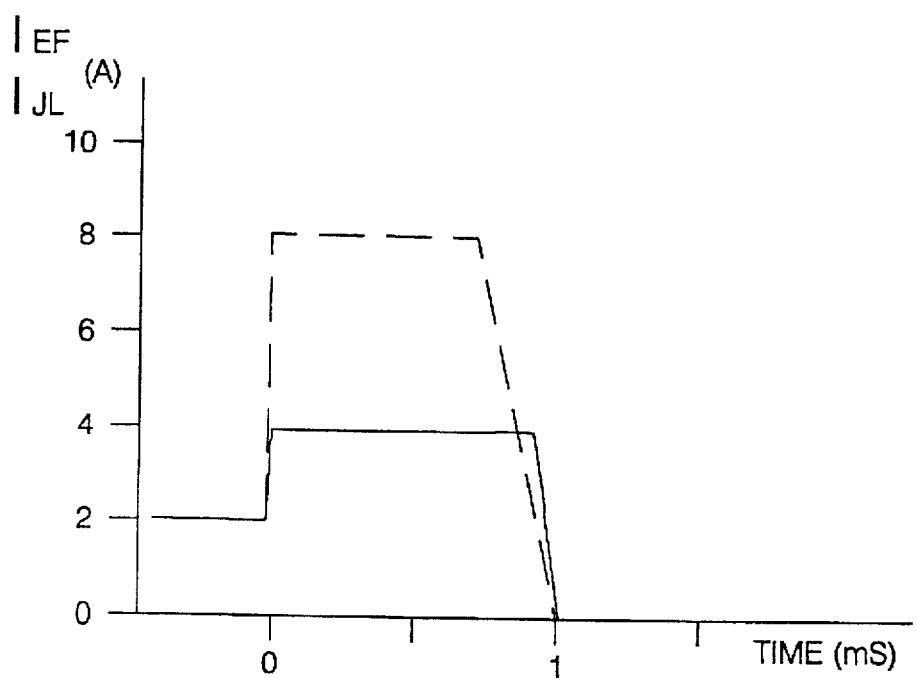

FIG. 6 shows a current IEF-voltage VEF static characteristic of this overcurrent protective circuit when the overcurrent flows.

The solid line shows a case when the overcurrent is cut-off by the overcurrent protective circuit. When an overcurrent flows, the current increases to 4 A from a normal current 2 A. The overcurrent is kept to 4 A for a permissible time of the load and about 1 mS later, this overcurrent protective circuit cuts off the overcurrent.

The broken line shows a case that a fuse or a circuit breaker cuts off the overcurrent without this overcurrent protective circuit. When the overcurrent flows, the overcurrent increases to 8 A from a normal current 2 A. The overcurrent is kept to 8 A and about 1 mS later, the fuse or the circuit breaker will cut off the overcurrent.

The second overcurrent protective circuit of the present invention can be made as a monolithic semiconductor chip.

This second circuit has a two outer terminals construction where the voltage drop between the source and the drain of the N-type EMOS 21 is its gate voltage. Therefore, when the normal current flows, the voltage drop between the source and the drain of the N-type EMOS 21 is about 1.5 volt. The third overcurrent protective circuit of the present invention is a three outer terminals construction in which a gate voltage is applied from a third outer terminal. Thereby, when the normal current flows, the voltage drop at both ends of the third circuit is about 0.8 volts.

The overcurrent protective circuit is set to have the same maximum load current and the delay time for cutting-off as that of the second protective circuit.

Figure 7:
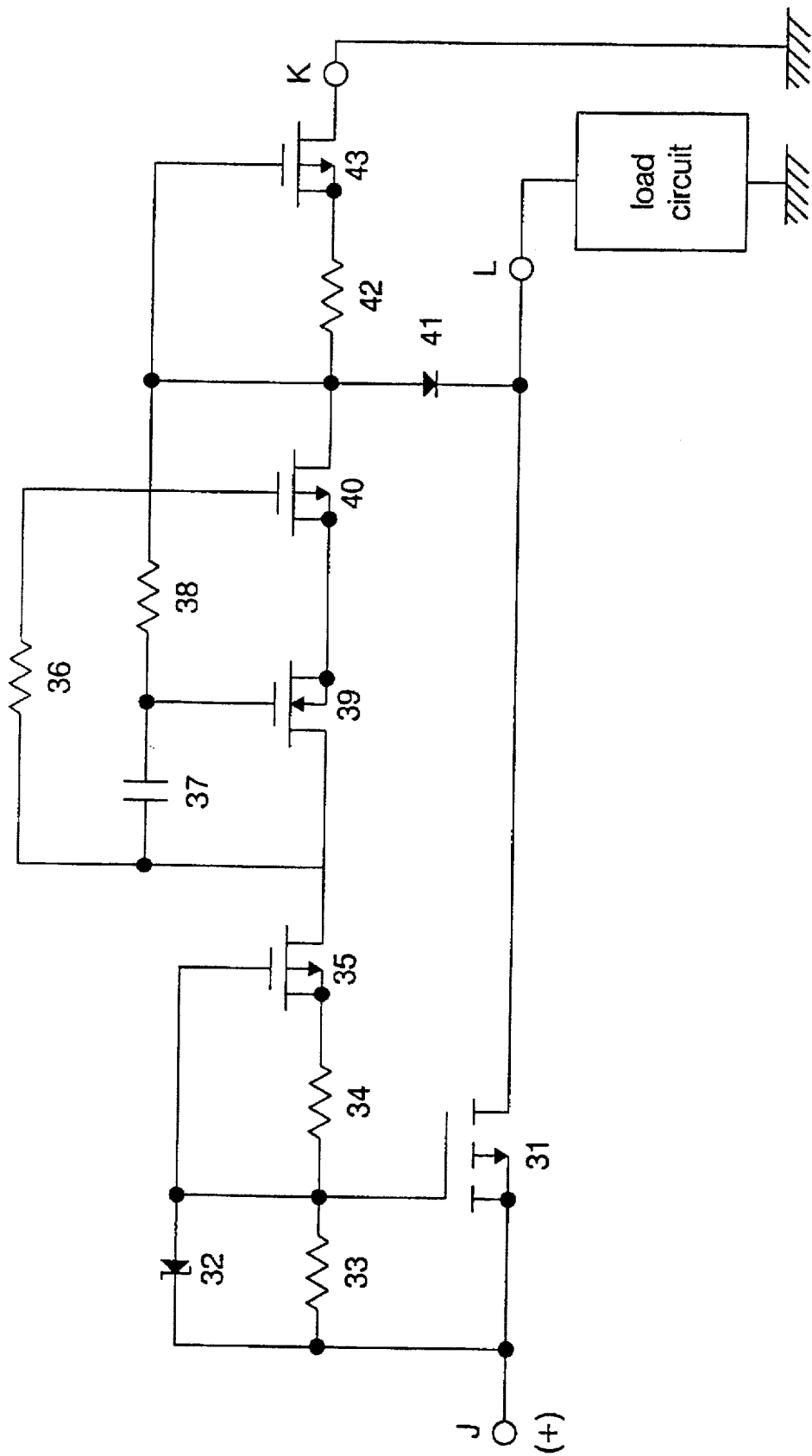
FIG. 7 is a circuit diagram showing the third overcurrent protective circuit according to the present invention.

The function of the third overcurrent protective circuit of one example of the present invention is explained according to FIG. 7.

A Zener diode 32 is connected at its anode to the gate of a enhancement mode P-type MOS (hereinafter referred to as P-type EMOS) 31 and is connected at its cathode to the source of the P-type EMOS 31. A resistor 33 is connected between the source and the gate of the P-type EMOS 31 and a constant current circuit of a P-type DMOS 35 and a resistor 34 are connected to the gate of the P-type EMOS 31. The source of the P-type DMOS 35 is connected through a resistor 34 to the gate of the P-type EMOS 31. The gate of the P-type DMOS 35 is connected to the gate of the P-type EMOS 31. The gate of the P-type DMOS 35 is connected to the gate of the P-type EMOS 31. The constant current circuit is hereinafter referred to as the second constant circuit.

To the drain of the P-type DMOS 35, the overcurrent protective circuit is connected. In the circuit, the source of a N-type DMOS 39 is connected to the source of a P-type DMOS 40. A capacitor 37 is connected at one end to the gate of the N-type DMOS 39 and is connected at its other end to the drain of the N-type DMOS 39. A resistor 38 is connected at one end to the gate of the N-type DMOS 39 and is connected at its other end to the drain of the P-type DMOS 40. A resistor 36 is connected at one end to the gate of the P-type DMOS 40 and is connected at its other end to the drain of the N-type DMOS 39. The drain of the P-type DMOS 35 is connected to the drain of the N-type DMOS 39.

To The drain of the P-type DMOS 40, another constant current circuit is connected. In the circuit, the source of a P-type DMOS 40 is connected through a resistor 42 to the drain of the P-type DMOS 43 and the gate of the P-type DMOS 43 is connected to the drain of the P-type DMOS 40. The constant current circuit is hereinafter referred to as the first constant current circuit. The drain of the P-type DMOS 40 is connected through a diode 41 to the drain of P-type EMOS 31. The diode 41 is connected at its anode to the drain of the P-type DMOS 40 and is connected at its cathode to the drain of the P-type EMOS 31.

The source of the P-type EMOS 31 is a first outer terminal J, while its drain is a second outer terminal L and the drain of the P-type DMOS 43 is a third outer terminal K.

The constant current capacity of the second constant current circuit is from 1.3 to 5 times as large as the constant current capacity of the fist constant current circuit. The cut-off current capacity of the N-type DMOS 39 and the P-type DMOS 40 may be set to more than the constant current capacity of the first constant current circuit and less than the constant current capacity of the second constant current circuit.

As shown in FIG. 7, the outer terminal J of this third overcurrent protective circuit is connected to a plus power source, while its outer terminal L is connected to one end of a load to be protected and its outer terminal K is connected to a ground (which supplies a gate voltage). The other end of the load is connected to the ground.

Now, when the plus power source is turned on, at first a current flows to the gate circuit of the P-type EMOS 31. The current from the plus power source flows through the Zener diode 32 and the resistor 33 and also through the second constant current circuit, the overcurrent cut-off circuit (the N-type DMOS 39 and to the P-type DMOS 40) and the first constant current circuit to the ground.

The constant current capacity of the first constant current circuit and the zener voltage of the Zener diode 32 and the resistance of the resistor 33 are chosen so that the constant voltage drop at both ends of resistor 33 is generated more than the threshold voltage of the P-type EMOS 31 by the constant current of the first constant current circuit.

Therefore, the gate voltage of the P-type EMOS 31 exceeds its threshold voltage, thereby the P-type EMOS 31 becomes conductive, resulting in normal current (drain current) flow in the load.

The cut-off static characteristic of this overcurrent protective circuit will be explained as follows.

When a voltage VJK is applied across the outer terminal J with positive potential and the outer terminal K (i.e., ground) with negative potential, then the gate voltage of the P-type EMOS 31 is a constant voltage which is more than its threshold voltage. Therefore the P-type EMOS 31 becomes conductive. In the P-type EMOS 31 is conductive. The current-voltage static characteristic between the voltage VJL and the current IJL in P-type EMOS 31 is as follows. When the voltage VJL increases gradually, the current IJL increases gradually in a linear characteristic range. When the voltage VJL increases more, the current IJL reaches gradually in a saturation characteristic range. When the voltage VJL increases more then, the drain current IJL is constant. However, when the voltage VJL exceeds the gate voltage of the P-type EMOS 31, the diode 41 becomes conductive, thereby the gate current of the P-type EMOS 31 increases. When the gate current of the P-type EMOS 31 exceeds the cut-off current capacity of the N-type DMOS 39 and the P-type DMOS 40, the N-type DMOS 39 and the P-type DMOS 40 cut off the gate current of the P-type EMOS 31. Thus the gate voltage of the P-type EMOS 31 drops to voltage 0, the P-type EMOS 31 becomes non-conductive.

Figure 8:
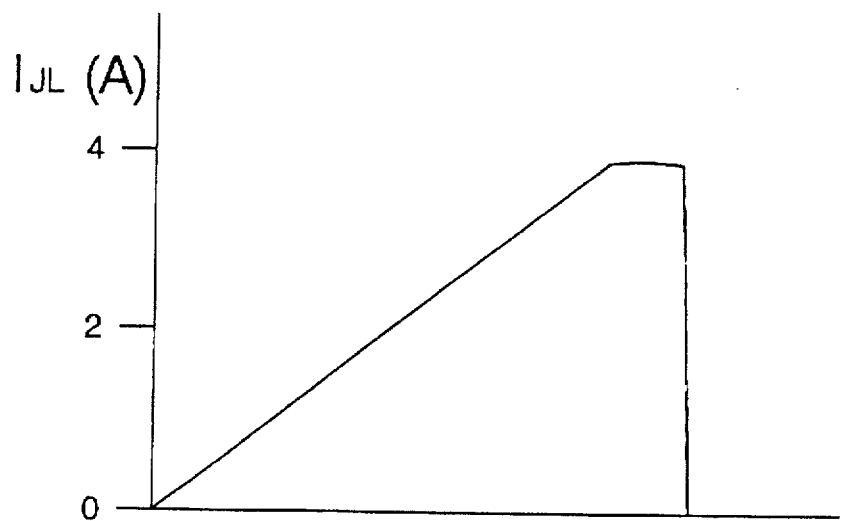
FIGS. 8 and 9 show static cut-off characteristics of the circuit shown in FIG. 7.
Figure 9:
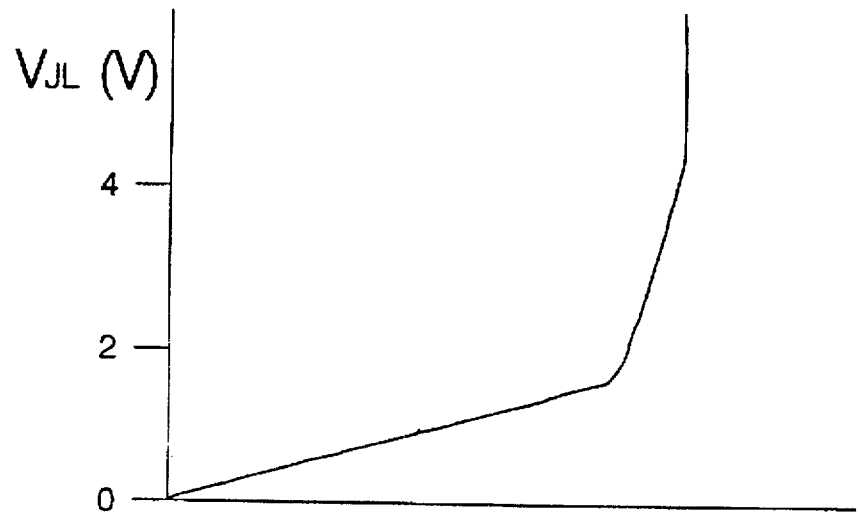

The static characteristic of current IJL- voltage VJL of one example of this circuit to prevent overcurrent is shown in FIGS. 8 and 9 (The FIG. 8 shows the current IJL, the FIG. 9 shows the voltage VJL. The horizontal axis in FIG. 8 and FIG. 9 is the same ratio for each figure).

From the starting voltage 0 (VJL>0 volt): When the voltage VJL is about 0.8 V, the current IJL is 2 A. When the voltage VJL is about 1.6 V, the current IJL is 4 A. When the voltage VJL is between about 1.6 V and about 4.3 V, the current IJL is saturated at 4 V. When the voltage VJL exceeds about 4.3 A of the gate voltage of the P-type EMOS 31, the diode 41 becomes conductive to cut off the current IJL.

The overcurrent protective circuit of the N-type DMOS 39 and P-type DMOS 40 will be explained as follows.

The source of the N-type DMOS 39 is connected to the source of the P-type DMOS 40. A capacitor 37 is connected at one end to the gate of the N-type DMOS 39 and is connected at its other end to its drain. A resistor 38 is connected at one end to the gate of the N-type DMOS 39 and is connected at its other end to the drain of the P-type DMOS 40. A resistor 36 is connected at one end to the gate of the P-type DMOS 40 and is connected at its other end to the drain of the N-type DMOS 39. Therefore, the potential difference of the P-type DMOS 40 is the gate voltage of the N-type DMOS 39, while the potential difference of the N-type DMOS 39 is the gate voltage of the P-type DMOS 40.

When a voltage is applied across the drain of the N-type DMOS 39 with positive potential and the drain of the P-type DMOS 40 with negative potential and then the voltage increases, the drain current of the N-type DMOS 39 increases in a linear characteristic range until a preset value. When the drain current of the N-type DMOS 39 exceeds the preset value, then the gate voltage of the N-type DMOS 39 and the P-type DMOS 40 increases each other. Thereby the N-type DMOS 39 and the P-type DMOS 40 reduce the drain current. After that, the N-type DMOS 39 and the P-type DMOS 40 reach to the pinch-off state and cut off the drain current.

This overcurrent protective circuit also requires some extent of delay characteristic. The capacitor 37 is connected to the resistor 38 in the gate of the N-type DMOS 39. Therefore, the circuit of the N-type DMOS 39 and the P-type DMOS 40 can be cut off after the delay time which is proportional to the time constant of the capacitor 37 and the resistor 38. Adjustment of the capacity of the capacitor 37 and the resistance of the resistor 38 can causes changes in the cut-off time (the delay characteristic).

The case that the rush current flows will be explained as follows.

When a power source is turned on and the rush current tends to flow to the load, at first, the source-drain voltage (i.e., voltage VJL) in P-type EMOS 31 is still more than its gate voltage. Thereby, in the gate circuit of the P-type EMOS 31, the constant current of the first constant current circuit flows and at same time a large current tends to flow through the diode 41. However the large current through the diode 41 is kept within the constant current of the second constant current circuit.

Accordingly, the current through the Zener diode 32 and the resistor 33 to be connected in parallel does not exceed the constant current of the second constant circuit. When the rush current flows, the gate voltage of the P-type EMOS 31 is kept almost constant to the zener voltage. Thus the rush current is kept the drain current IJL (4 A) of the P-type EMOS 31. After the rush current state of the load finishes, when the normal current of the load flows, the source-drain voltage of the P-type EMOS 31 is about 0.8 volts. The diode 41 then becomes non-conductive, and the gate current of the P-type EMOS 31 becomes the constant current of the first constant current circuit.

The rush current characteristic of the third overcurrent protective circuit is the same as that of the second overcurrent protective circuit. When a power source is turned on, the rush current increases to 4 A and is kept to 4 A for about 0.3 mS. After that, the rush current declines gradually to a normal current 2 A about 2 mS later.

The case where the overcurrent flows will be explained as follows.

When an overcurrent flows suddenly under a normal current 2 A flowing state in the load, the drain current of the P-type EMOS 31 increases from 2 A in a linear region to 4 A in a saturated region. When the overcurrent finishes within a permissible time of the load, a normal current of 2 A flows in the load again. When the overcurrent does not finish within a permissible time of the load, after the permissible time of the load, the P-type EMOS 31 becomes non-conductive to cut off the overcurrent.

The overcurrent characteristic of the third overcurrent protective circuit is the same as that of the second overcurrent protective circuit. When the overcurrent flows, the overcurrent increases from a normal current of 2 A to 4 A. The overcurrent is kept to 4 A for a permissible time of the load, and about 1 mS later, the overcurrent protective circuit can cut off the overcurrent.

The third overcurrent protective circuit of the present invention can be made as a monolithic semiconductor chip.

The second overcurrent protective circuit is composed of N-type EMOS, while the third overcurrent protective circuit is composed of P-type EMOS. Conversely, the second circuit can be composed of P-type EMOS, while the third circuit can be composed of N-type EMOS.

Now, for explaining the AC overcurrent protective circuit, each of the gate circuits of the first overcurrent protective circuit is respectively indicated as a block.

Figure 10:
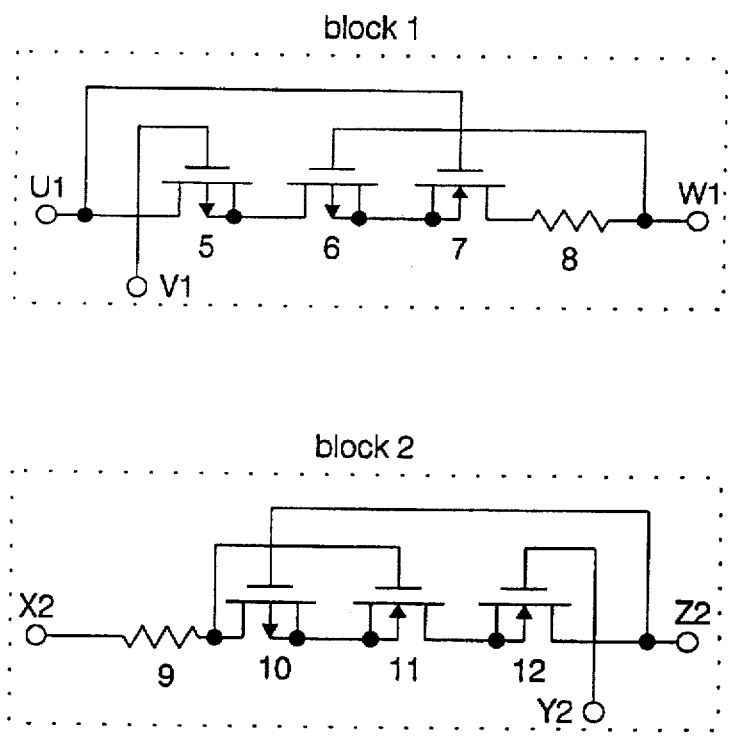
FIG. 10 is a block diagram of the gate circuit.

As shown in FIG. 10, the source of the P-type DMOS 5 is connected to the drain of the P-type DMOS 6, and the source of the P-type DMOS 6 is connected to the source of the N-type DMOS 7. A resistor 8 is connected at one end to the drain of the N-type DMOS 7 and is connected at its other end to the gate of the P-type DMOS 6. The gate of the N-type DMOS 7 is connected to the drain of the P-type DMOS 5. The drain of the P-type DMOS 5 to be connected to the gate of the N-type DMOS 1 is a terminal U1. The gate of the P-type DMOS 5 to be connected to the source of the N-type DMOS 1 is a terminal V1. The other end of the resistor 8 to be connected to the drain of the P-type DMOS 2 is a terminal W1.

As shown in FIG. 10, the source of the P-type DMOS 10 is connected to the source of the N-type DMOS 11, and the drain of the N-type DMOS 11 is connected to the source of the N-type DMOS 12. The gate of the P-type DMOS 10 is connected to the drain of the N-type DMOS 12. The gate of the N-type DMOS 11 is connected to the drain of the P-type DMOS 10. The drain of the P-type DMOS 10 is connected to the one end of the resistor 9. The other end of the resistor 9 to be connected to the drain of the N-type DMOS 1 is a terminal X2. The gate of the N-type DMOS 12 to be connected to the source of the P-type DMOS 2 is a terminal Y2. The drain of the N-type DMOS 12 to be connected to the gate of the P-type DMOS 2 is a terminal Z2.

Now, each of blocks is indicated by a dotted line quadrangle and three terminals.

Figure 11:
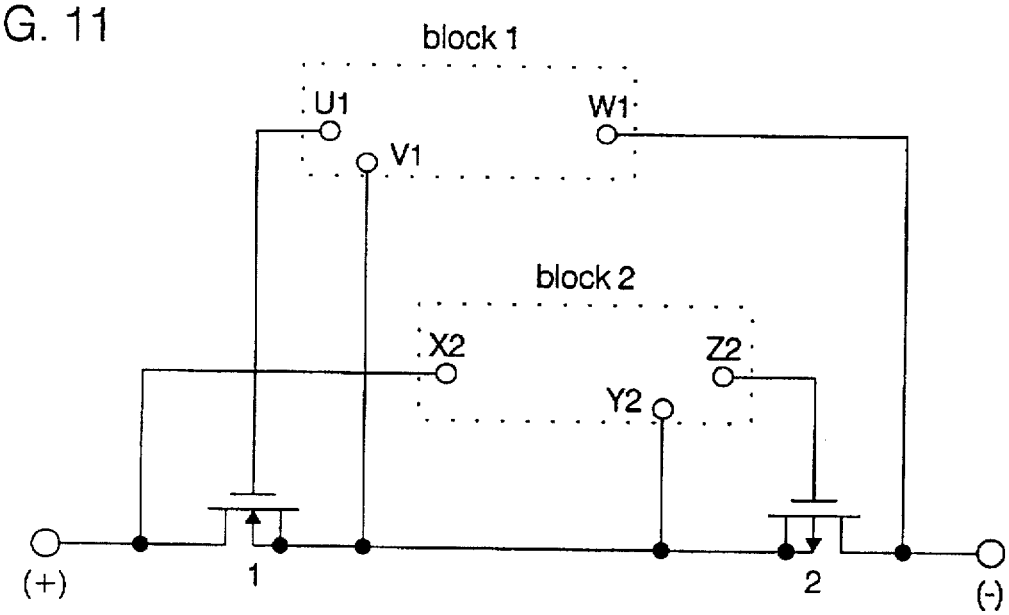
FIG. 11 is a block diagram of the overcurrent protective circuit shown in FIG. 1.

The overcurrent protective circuit of FIG. 1 is shown as FIG. 11 with the gate circuit 1 and 2. The source of the N-type DMOS 1 is connected to the source of the P-type DMOS 2. The terminal U1 of the gate circuit 1 is connected to the gate of the N-type DMOS 1, the terminal V1 to the source of the N-type DMOS 1, and the terminal W1 to the drain of the P-type DMOS 2. The terminal X2 of the gate circuit 2 is connected to the drain of the N-type DMOS 1, the terminal Y2 to the source of the P-type DMOS 2, and the terminal Z1 to the gate of the P-type DMOS 2. Now, the correction circuit is omitted.

Figure 12:
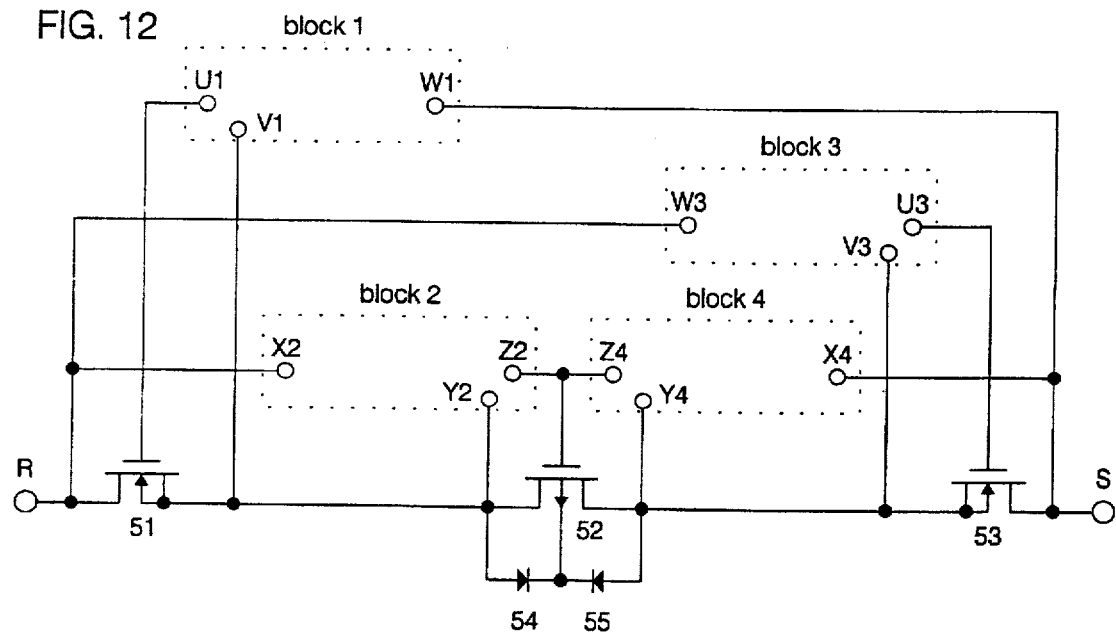
FIG. 12 is a block diagram of the AC overcurrent protective diagram according to the present invention.

FIG. 12 shows a circuit to prevent overcurrent for alternating current. The one end of the P-type DMOS 52 which is connected to the source of the N-type DMOS 51 is a first terminal T1, while the other end which is connected to the source of the N-type DMOS 53 is a second terminal T2.

The source of the N-type DMOS 51 is connected to the first terminal T1 of the P-type DMOS 52 and the second terminal T2 of the P-type DMOS 52 is connected to the source of the N-type DMOS 53. The terminal U1 of block (the gate circuit) 1 is connected to the gate of the N-type DMOS 51, while the terminal V1 is connected to the source of the N-type DMOS 51 and the terminal W1 is connected to the drain of the N-type DMOS 53.

The terminal X2 of block (the gate circuit) 2 is connected to the drain of the N-type DMOS 51, while the terminal Y2 is connected to the terminal T1 of the P-type DMOS 52 and the terminal Z2 is connected to the gate of the P-type DMOS 52.

The terminal W3 of the gate circuit 3 is connected to the drain of the N-type DMOS 51, while the terminal V3 is connected to the source of the N-type DMOS 53 and the terminal U3 is connected to the gate of the N-type DMOS 53.

The terminal Z4 of the gate circuit 4 is connected to the gate of the P-type DMOS 52, while the terminal Y4 is connected to the terminal T2 of the P-type DMOS 52, while the terminal X4 is connected to the drain of the N-type DMOS 53. The anode of the diode 54 is connected to the terminal T1 of the P-type DMOS 52, its cathode is connected to the channel of the P-type DMOS 52. The anode of the diode 55 is connected to the terminal T2 of the P-type DMOS 52, which cathode is connected to the channel of the P-type DMOS 52.

The drain of the N-type DMOS 51 is the outer terminal R, and the drain of the N-type DMOS 53 is the outer terminal S.

The gate circuit block 3 is the same as the gate circuit block 1. The gate circuit, block 4 is the same as the gate circuit block 2.

The function of each parts will be explained as follows.

As mentioned in the first overcurrent protective circuit, when the gate charge-current of the N-type DMOS 1 flows, the gate circuit of the N-type DMOS 1 becomes a low resistance state. When its gate discharge-current flows, the gate circuit of the N-type DMOS 1 achieve a high resistance state or a cut-off state. Similarly, when the gate charge-current of the N-type DMOS 51 flows, the gate circuit 1 achieves a low resistance state. When its gate discharge-current flows, the gate circuit 1 achieves a high resistance state or a cut-off state. When the gate charge-current of the N-type DMOS 53 flows, the gate circuit 3 achieves a low resistance state. When its gate discharge-current flows, the gate circuit 3 achieves a high resistance state or a cut-off state. In the gate circuit of the P-type DMOS 52, when its gate current flows from the outer terminal R to the outer terminal S, the gate circuit 2 achieves a low resistance state, and the gate circuit 4 achieves a high resistance state or a cut-off state. Conversely, when its gate current flows from the outer terminal S to the outer terminal R, the gate circuit 4 achieves a low resistance state, and the gate circuit 2 achieves a high resistance state or a cut-off state.

According to this connection, when a voltage VRS is applied across the outer terminal R with positive potential and the outer terminal S with negative potential, the gate circuit 1 and 2 achieves a low resistance state, and the gate circuit 3 and 4 achieves a high resistance state or a cut-off state. Therefore, the potential difference in the P-type DMOS 52 is the gate voltage of the N-type DMOS 51, and the potential difference in the N-type DMOS 51 is the gate voltage of the P-type DMOS 52.

In the P-type DMOS 52, its terminal T1 is connected to the anode of the diode 54 and its cathode is connected to the channel of the P-type DMOS 52. Therefore the channel of the P-type DMOS 52 becomes nearly the same potential as the terminal T1. Thereby the first terminal T1 is the source of the P-type DMOS 52 and the second terminal T2 is its drain.

Then, the N-type DMOS 51 and the P-type DMOS 52 functions the same as the N-type DMOS 1 and the P-type DMOS 2 of the first circuit to prevent overcurrent.

When the voltage VRS increases, a current IRS increases until a preset value. When an overcurrent IRS more than the preset value tends to flow, the N-type DMOS 51 and the P-type DMOS 52 becomes non-conductive to cut off the overcurrent IRS.

Conversely, when a voltage VRS is applied across the outer terminal S with positive potential and the outer terminal R with negative potential, the gate circuit 3 and 4 achieves a low resistance state, and the gate circuit 1 and 2 achieves a high resistance state or a cut-off state. Therefore, the potential difference in the P-type DMOS 52 is the gate voltage of the N-type DMOS 53, and the potential difference in the N-type DMOS 53 is the gate voltage of the P-type DMOS 52.

In the P-type DMOS 52, the terminal T2 is connected to the anode of the diode 55 and its cathode is connected to the channel of the P-type DMOS 52. Therefore the channel of the P-type DMOS 52 becomes nearly the same potential as the terminal T2. Thereby the second terminal T2 is the source of the P-type DMOS 52 and the first terminal T1 is its drain. Then, the N-type DMOS 53 and the P-type DMOS 52 functions the same as the N-type DMOS 1 and the P-type DMOS 2 of the first circuit to prevent overcurrent. When the voltage VRS increases, a current IRS increases until a preset value. When an overcurrent IRS more than the preset value tends to flow, the N-type DMOS 53 and the P-type DMOS 52 become non-conductive to cut off the overcurrent IRS.

Figure 13:
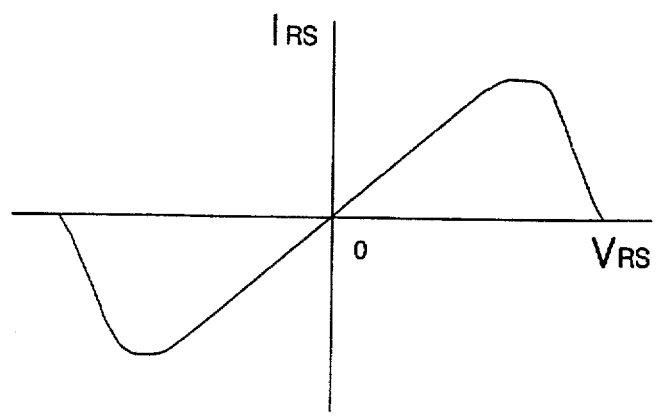
FIG. 13 is a graph showing a static cut-off characteristic of the circuit shown in FIG. 12.

The cut-off static characteristic of the alternating current of the overcurrent protective circuit is shown in FIG. 13.

The P-type DMOS 52 employed in the circuit to prevent overcurrent for alternating current of the present invention is shown in FIG. 14.

Figure 15A:
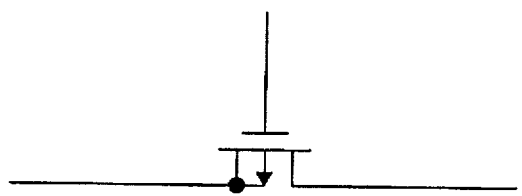
FIG. 15 is a symbol (a) and a sectional view (b) of the conventional P-type DMOS.
Figure 15B:
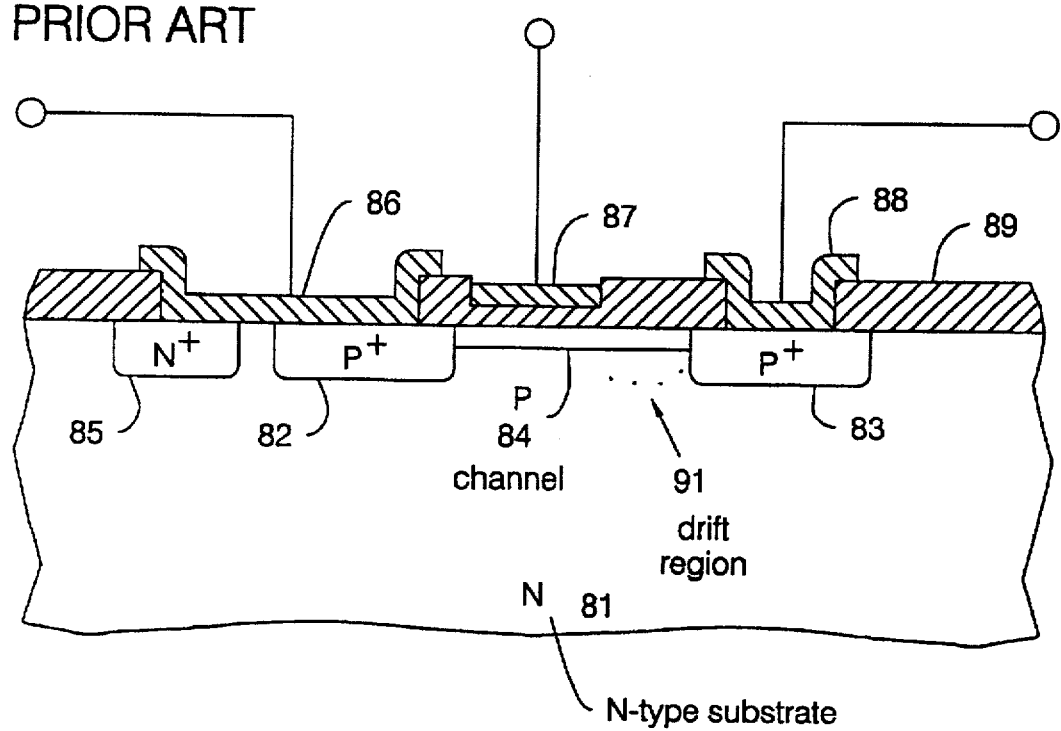

The normal P-type DMOS is shown in FIG. 15. FIG. 15(a) shows a mark to indicate a normal P-type DMOS. FIG. 15(b) shows a cross section of a semiconductor structure of a normal P-type DMOS.

In FIG. 15(b), the normal P-type DMOS comprises a N-type silicon body 81. A P+-type source region 82 and a P+-type drain region 83 is formed in the N-type silicon body 81. A depletion mode P-type channel region 84 and a N+-type region 85 is formed in the N-type silicon body 81. An insulated layer 89 of silicon dioxide is formed on the surface of the N-type silicon body 81. A source electrode 86 is formed on the P+-type source region 82 and the N+-type region 85. A drain electrode 88 is formed on the P+-type drain region 83. A gate electrode 87 is formed on the channel region 84. Further a region 91 is the drift region of the P-type channel 84 to rise a drain voltage.

In the normal P-type DMOS as shown in FIG. 15(b), the N-type silicon body 81 is connected to the N+-type region 85 with an ohmic contact. Thus the N-type silicon body 81 is the same potential as the P+-type source region 82.

Figure 14A:
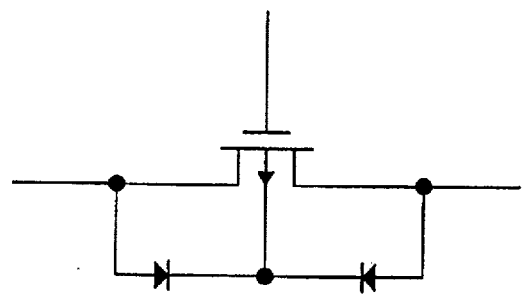
FIG. 14 is a symbol diagram (a) and a sectional view (b) of the P-type DMOS.

FIG. 14(a) shows a mark to indicate the P-type DMOS employed in the present invention.

Figure 14B:
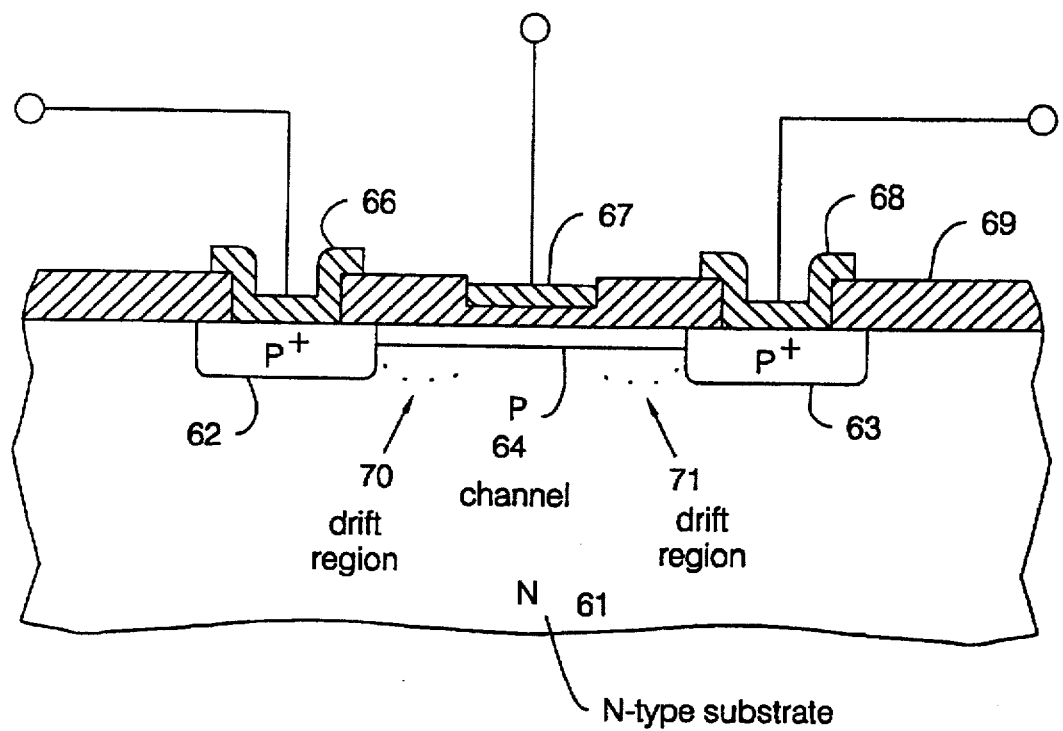

FIG. 14(b) shows a cross section of semiconductor structure of the P-type DMOS employed in the present invention.

In FIG. 14(b), the P-type DMOS employed in the present invention comprises a N-type silicon body 61. A P+-type region 62 and 63 to become a source or a drain is formed in the N-type silicon body 61. A depletion mode P-type channel region 64 is formed in the N-type silicon body 61. An insulated layer 69 of silicon dioxide is formed on the surface of the N-type silicon body 61. An electrode 66 is formed on the P+-type region 62. A electrode 68 is formed on the P+-type region 63. A gate electrode 67 is formed on the channel region 64. Further regions 70 and 71 are drift regions of the P-type channel 64 to rise a drain voltage.

In the P-type DMOS employed in this circuit to prevent overcurrent for alternating current as shown in FIG. 14(b), the N-type silicon body 61 is connected to both of the P+-type regions 62 and 63 with a pn junction (as indicated by a diode 54 in FIG. 12). Thus, when a current flows from the electrode 66 with positive potential to the electrode 68 with negative potential, the N-type body 61 becomes nearly the same potential as the P+-type region 62 with a pn junction of the right direction (which is the diode 54 in FIG. 12) from the P+-type region 62 to the N-type body 61. Thereby the P+-type region 62 becomes the source of the P-type DMOS, and the P+-type region 63 becomes its drain.

Also, when a current flows from the electrode 68 with positive potential to the electrode 66 with negative potential, the N-type body 61 becomes nearly the same potential as the P+-type region 63 with a pn junction of the right direction (which is the diode 55 in FIG. 12) from the P+-type region 63 to the N-type body 61. Thereby the P+-type region 63 becomes the source of the P-type DMOS, and the P+-type region 62 becomes its drain.

According to this composition, in the P-type DMOS employed in this circuit to prevent overcurrent for alternating current of the present invention, one electrode with positive potential is the source of the P-type DMOS, the other electrode with negative potential is its drain, for an alternating current of alternating. Therefore, as shown in FIG. 12, the N-type DMOS 51 and 53 and the P-type DMOS 52 can cut off an overcurrent of both directions in an alternating current.

The overcurrent protective circuit for alternating current can be made as a monolithic semiconductor chip.

According to the present invention, the first, the second and the third overcurrent protective circuits as well as the AC-type overcurrent protective circuit can be designed to make the value of the rated current and the maximum load current have a wide range capacity from 20 mA to 20 A and from 50 mA to 50 A by adjusting the current capacity of the N-type DMOS, the P-type DMOS, the N-type EMOS and the P-type EMOS.

Further, according to the present invention, the overcurrent protective circuit can be adjusted to meet the cut-off characteristic of the load by adjusting the capacity of the resistors and the capacitors.

Furthermore, according to the present invention, the AC-type overcurrent circuit can be constructed easily by arranging two of the second and the third overcurrent protective circuits in opposite directions and in series or in parallel.

As mentioned above, the overcurrent protective circuit and semiconductor circuit according to the present invention is useful to protect an electrical apparatus and a sensitive electronic circuit from the overcurrent in such a manner that the rush current and the overcurrent can be suppressed to about 1.5 to 2 times of the normal current. Thereby, the overcurrent protective circuit can prevent a large current flowing in the load even if for a short time and protect the load positively, so that the overcurrent protective circuit is suitable to protect a high reliable apparatus and an electric and electronic circuit for high cost industrial apparatuses.

What is claimed is:

1. An overcurrent protective circuit comprising:
   a first N-type DMOS (1) having a drain that is a positive outer terminal of the circuit and a first P-type DMOS (2) having a drain that is a negative outer terminal of the circuit, and wherein a source of said first N-type DMOS (1) is connected to a source of said first P-type DMOS (2),
   a gate of said first N-type DMOS (1) is connected to a drain of a second P-type DMOS (5), a source of said second P-type DMOS (5) is connected to a drain of a third P-type DMOS (6), a source of said third P-type DMOS (6) is connected to a source of a second N-type DMOS (7), a drain of said second N-type DMOS (7) is connected to one end of a first resistor (8), another end of said first resistor (8) is connected to the drain of said first P-type DMOS (2), a gate of said second P-type DMOS (5) is connected to the source of said first N-type DMOS (1), a gate of said third P-type DMOS (6) is connected to the drain of said first P-type DMOS (2), a gate of said second N-type DMOS (7) is connected to the drain of said second P-type DMOS (5), a drain of a fourth P-type DMOS (10) is connected to one end of a second resistor (9), another end of said second resistor (9) is connected to the drain of said first N-type DMOS (1), a source of said fourth P-type (10) is connected to a source of a third N-type DMOS (11), a drain of said third N-type DMOS (11) is connected to a source of a fourth N-type DMOS (12), a drain of said fourth N-type DMOS (12) is connected to a gate of said first P-type DMOS (2), a gate of said fourth P-type DMOS (10) is connected to the drain of said fourth N-type DMOS (12), a gate of said third N-type DMOS (11) is connected to the drain of said fourth P-type DMOS (10), and a gate of said fourth N-type DMOS (12) is connected to the source of said first P-type DMOS (2).

2. The overcurrent protective circuit according to claim 1, wherein a correction circuit is separately connected thereto in parallel so that, a source of a fifth N-type DMOS (3) is connected to a source of a fifth P-type DMOS (4), a gate of said fifth N-type DMOS (3) is connected to the gate of said first N-type DMOS (1), a gate of said fifth P-type DMOS (4) is connected to the gate of said first P-type DMOS (2), a first fuse (13) is connected at one end to a drain of said fifth N-type DMOS (3) and is connected at another end to the drain of said first N-type DMOS (1), a second fuse (14) is connected at one end to the drain of said fifth P-type DMOS (4) and is connected at another end to the drain of said first P-type DMOS (2).

3. The overcurrent protective circuit according to claim 2, wherein said correction circuit has a drain current capacity of 5 to 15% of a total drain current capacity of the overcurrent protective circuit.

4. An overcurrent protective circuit comprising:

a first constant current circuit for keeping a constant gate current and an overcurrent cut-off circuit for cutting off the gate current when an overcurrent flows, both circuits being connected between a drain and a gate of an N-type EMOS (21), wherein the drain of said N-type EMOS (21) is a positive outer terminal and a source thereof is connected to one end of a coil to make the other end a negative outer terminal to which a resistor (29) of said constant current circuit is connected at one end thereof and another end of said resistor (29) of said constant current circuit is connected to the gate of said N-type EMOS (21) so that when a rush current begins to flow between the positive outer terminal and the negative outer terminal, a sudden change of current is stopped due to an inductance of said coil and a large voltage is generated at both ends of said coil for an instant, thereby the gate voltage of said N-type EMOS (21) drops for an instant to suppress the rush current to a maximum load current.

5. The overcurrent protective circuit according to claim 4, wherein the drain of said N-type EMOS (21) is connected to a drain of a first N-type DMOS (26), a source of said first N-type DMOS (26) is connected to a source of a P-type DMOS (27), a drain of said P-type DMOS (27) is connected to a drain of a second N-type DMOS (28), a source of said second N-type DMOS (28) is connected to the gate of said N-type EMOS (21), a resistor (29) is connected at one end to the gate of said N-type EMOS (21) and is connected at another end to said negative outer terminal, a resistor (23) is connected at one end to a gate of said first N-type DMOS (26) and is connected at another end to the source of said second N-type DMOS (28), a resistor (24) is connected at one end to a gate of said P-type DMOS (27) and is connected at another end to the drain of said first N-type DMOS (26), a capacitor (25) is connected at one end to the gate of said P-type DMOS (27) and is connected at another end to the drain of said P-type DMOS (27), and the gate of said second N-type DMOS (28) is connected to said negative outer terminal.

6. An overcurrent protective circuit comprising a first constant current circuit having a resistor (34) connected at one end to a source of a first P-type DMOS (35) and is connected at another end to a gate of a P-type EMOS (31) and a gate of said first P-type DMOS (35) is connected to a gate of said P-type EMOS (31) where the source is a positive outer terminal of said circuit and the drain thereof is a negative outer terminal of said circuit, an overcurrent cut-off circuit having a source of a N-type DMOS (39) connected to a source of a second P-type DMOS (40), a capacitor (37) is connected at one end to a gate of said N-type DMOS (39) and at another end to a drain of said N-type DMOS (39) and a resistor (38) is connected at one end to the gate of said N-type DMOS (39) and at another end to a drain of said second P-type DMOS (40), a resistor (36) is connected at one end to a gate of said second P-type DMOS (40) and at another end to the drain of said N-type DMOS (39), and the drain of said N-type DMOS (39) is connected to the drain of said first P-type DMOS (35) in said first constant current circuit, a second constant current circuit having a resistor (42) connected at one end to a source of a third P-type DMOS (43) and at another end to the drain of said second P-type DMOS (40) in said overcurrent cut-off circuit, a gate of said third P-type DMOS (43) is connected to the drain of said second P-type DMOS (40), and a drain of said third P-type DMOS (430) to a supply of the gate voltage, and an anode of a diode (41) is connected to the drain of said second P-type DMOS (40) and a cathode to the drain of said P-type EMOS (31), an anode of a Zener diode (32) is connected to the gate of said P-type EMOS (31) and a cathode to the source of said P-type EMOS (31), and a resistor (33) is connected at one end to the gate of said P-type EMOS (31) and at another end to the drain of said P-type EMOS (31).

7. An AC-type overcurrent protective circuit comprising: a source of a first N-type DMOS (51) is connected to a first terminal of a first P-type DMOS (52) and a second terminal of said first P-type DMOS (52) is connected to a source of a second N-type DMOS (53),

- a terminal (U1) of a gate circuit block (1) is connected to a gate of said first N-type DMOS (51), a terminal (V1) is connected to a source of said first N-type DMOS (51), and a terminal (W1) is connected to a drain of said second N-type DMOS (53),
- a terminal (X2) of a gate circuit block (2) is connected to a drain of said first N-type DMOS (51), a terminal (Y2) is connected to the first terminal of said first P-type DMOS (52), and a terminal (Z2) is connected to a gate of said first P-type DMOS (52),
- a terminal (W3) of a gate circuit block (3) is connected to the drain of said first N-type DMOS (51), a terminal (V3) is connected to the source of said second N-type DMOS (53), and a terminal (U3) is connected to the gate of said second N-type DMOS (53), and
- a terminal (Z4) of a gate circuit block (4) is connected to the gate of said first P-type DMOS (52), a terminal (Y4) is connected to the second terminal of said first P-type DMOS (52), and a terminal (X4) is connected to the drain of said second N-type DMOS (53), wherein said first terminal of said first P-type DMOS (52) is connected to an anode of a diode (54), a cathode is connected to a channel region of said first P-type DMOS (52), said second terminal of said first P-type DMOS (52) is connected to an anode of a diode (55), a cathode of the diode (55) is connected to said channel region of said first P-type DMOS (52), and the drain of said first N-type DMOS (51) is used as one of two terminals and the drain of said second N-type DMOS (53) is used as the other of two terminals.

8. The AC-type overcurrent protective circuit according to claim 7, wherein said first P-type DMOS (52) is a semiconductor construction in which a N-type substrate (61) is not connected to a source electrode or a drain electrode and is connected through a P+ type region (62) to one electrode (66) and through a P+ type region (63) to another electrode (68),

- a P-type channel (64) is formed between the P+ regions (62) and (63), at both ends of said P-type channel (64) drift regions (70) and (71) are formed.

* * * * *